United States Patent [19]
Mizobuchi

[11] Patent Number: 6,160,967
[45] Date of Patent: Dec. 12, 2000

[54] CAMERA HAVING FLEXIBLE PRINTED CIRCUIT BOARD

[75] Inventor: Koji Mizobuchi, Sagamihara, Japan

[73] Assignee: Olympus Optical Co., Ltd., Tokyo, Japan

[21] Appl. No.: 09/250,819

[22] Filed: Feb. 17, 1999

[30] Foreign Application Priority Data

Mar. 6, 1998 [JP] Japan .................................. 10-054572

[51] Int. Cl.[7] .................................................. G03B 17/00
[52] U.S. Cl. ............................................ 396/542; 361/818
[58] Field of Search ............................ 396/542; 361/768, 361/816, 818

[56] References Cited

U.S. PATENT DOCUMENTS 5,181,065  1/1993  Hara ......................................... 396/542

FOREIGN PATENT DOCUMENTS 06233196  8/1994  Japan .

OTHER PUBLICATIONS

Nikkei Electronics, No. 633, pp. 80–90, published Jun. 3, 1996.

*Primary Examiner*—David M. Gray
*Attorney, Agent, or Firm*—Frishauf, Holtz, Goodman, Langer & Chick, P.C.

[57] ABSTRACT

A plurality of IC chips forming an electronic circuit serving to control at least a part of a camera body are mounted to a flexible printed circuit board. These plural IC chips are arranged in asymmetry with each other with respect to a predetermined bending line of the flexible printed circuit board such that, when the flexible printed circuit board is bent by about 180° along the predetermined bending line, these IC chips do not overlap with each other.

5 Claims, 2 Drawing Sheets

CAMERA HAVING FLEXIBLE PRINTED CIRCUIT BOARD

BACKGROUND OF THE INVENTION

The present invention relates to a camera including a flexible printed circuit board (hereinafter referred to as an "FPC") having electronic parts such as an IC mounted thereon.

An FPC, which is thin and can be bent easily, is used in many cases as a printed circuit board for mounting electronic parts used in a camera having a small allowance in the mounting space. When mounted in a camera, however, the FPC must be bent by substantially 180° in some cases because of the restriction in respect of the outer contour of the electronic part mounted in the camera or the mounting space of the camera body. Where the FPC is bent by about 180°, the electronic parts mounted thereon tend to be brought into mutual contact, making it necessary to take some measures for insulation. Further, in accordance with the recent tendency toward miniaturization of the camera, there is a need for a printed circuit board capable of mounting electronic parts at a higher density.

Under the circumstances, measures are taken to decrease the ratio of the mounting area of an IC to the area of the printed circuit board by subjecting an IC having a relatively large outer contour of the package such as a CPU among the electronic parts mounted on a printed circuit board for a camera to a flip chip mounting (hereinafter referred to as "mounting").

The FC mounting is featured in that, since a bare chip, i.e., a bare LSI chip which is not sealed and not packaged, is directly connected to a wiring pattern of a printed circuit board by using, for example, an anisotropic conductive adhesive, it is possible to minimize the IC mounting area. Feature articles on the FC mounting are carried in, for example, a technical magazine "NIKKEI ELECTRONICS, No. 633, pp 80–90" published on Jun. 3, 1996.

Further, Jpn. Pat. Appln. KOKAI Publication No. 6-233196 discloses an idea of forming an insulating sheet integrally on an FPC (flexible printed circuit board). It is possible for electronic parts which are FC-mounted on an FPC to have a positional relationship such that these electronic parts face each other when the FPC is bent by about 180°. The insulating sheet formed in JP '196 is intended to prevent short circuiting between the electronic parts when the FPC is bent. As a matter of fact, how to prevent short circuiting between electronic parts is a main object of JP '196.

However, if a plurality of electronic parts such as ICs, which are mounted on an FPC, are positioned to face each other when the FPC is bent, the thickness of the bent FPC is unavoidably increased in the portion where the electronic parts are positioned to face each other. It should also be noted that the insulating sheet is formed integrally with the FPC used as a printed circuit board in JP '196, with the result that the outer contour of the FPC is rendered larger and more complex in proportion to the number of bending times. Further, the bent FPC is rendered bulky with increase in the number of bending times, making it necessary to ensure an extra mounting space within the camera body.

BRIEF SUMMARY OF THE INVENTION

An object of the present invention, which has been achieved in view of the situation described above, is to provide a camera including a flexible printed circuit board (FPC) having electronic parts such as ICs flip chip (FC) mounted thereon, the FPC being bent and mounted in a camera body in a manner to decrease the total thickness of the bent FPC, to prevent short circuiting between the electronic parts such as ICs, and to suppress effects given by electromagnetic (electric field) interference and coupling to each IC.

According to one embodiment of the present invention, there is provided a camera, comprising:

a camera body; and a flexible printed circuit board having at least a plurality of IC chips mounted thereon as an electronic circuit serving to control at least a part of the camera body, wherein the plural IC chips are positioned asymmetric to each other with respect to a bending line in a central portion of the flexible printed circuit board such that, when the flexible printed circuit board is bent and mounted in the camera body, these IC chips do not overlap with each other.

According to another embodiment of the present invention, there is provided a camera, comprising:

a camera body; and a flexible printed circuit board having at least a first IC chip and a second IC chip mounted thereon to form an electronic circuit serving to control at least a part of the camera body, wherein the flexible printed circuit board is bent along a predetermined bending line to have first and second bent regions so as to be mounted in the camera body;

the first IC chip is mounted on the first region of the flexible printed circuit board;

the second IC chip is mounted on the second region of the flexible printed circuit board; and the first and second IC chips are positioned asymmetric to each other with respect to a bending line in a central portion of the flexible printed circuit board such that, when the flexible printed circuit board is bent and mounted in the camera body, these first and second IC chips do not overlap with each other.

According to another embodiment of the present invention, there is provided a camera, comprising:

a camera body; and a flexible printed circuit board having at least a plurality of electronic devices mounted thereon as an electronic circuit serving to control at least a part of the camera body, wherein the plural electronic devices are positioned asymmetric to each other with respect to a bending line in a central portion of the flexible printed circuit board such that, when the flexible printed circuit board is bent and mounted in the camera body, these electronic devices do not overlap with each other.

Further, according to still another embodiment of the present invention, there is provided a camera, comprising:

a camera body; and a flexible printed circuit board having at least a first electronic device and a second electronic device mounted thereon to form an electronic circuit serving to control at least a part of the camera body, wherein the flexible printed circuit board is bent along a predetermined bending line to have first and second bent regions so as to be mounted in the camera body;

the first electronic device is mounted on the first region of the flexible printed circuit board;

the second electronic device is mounted on the second region of the flexible printed circuit board; and the first and second electronic devices are positioned asymmetric to each other with respect to a bending line in a central portion of the flexible printed circuit board such that, when the flexible printed circuit board is bent and mounted in the camera body, these first and second electronic devices do not overlap with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
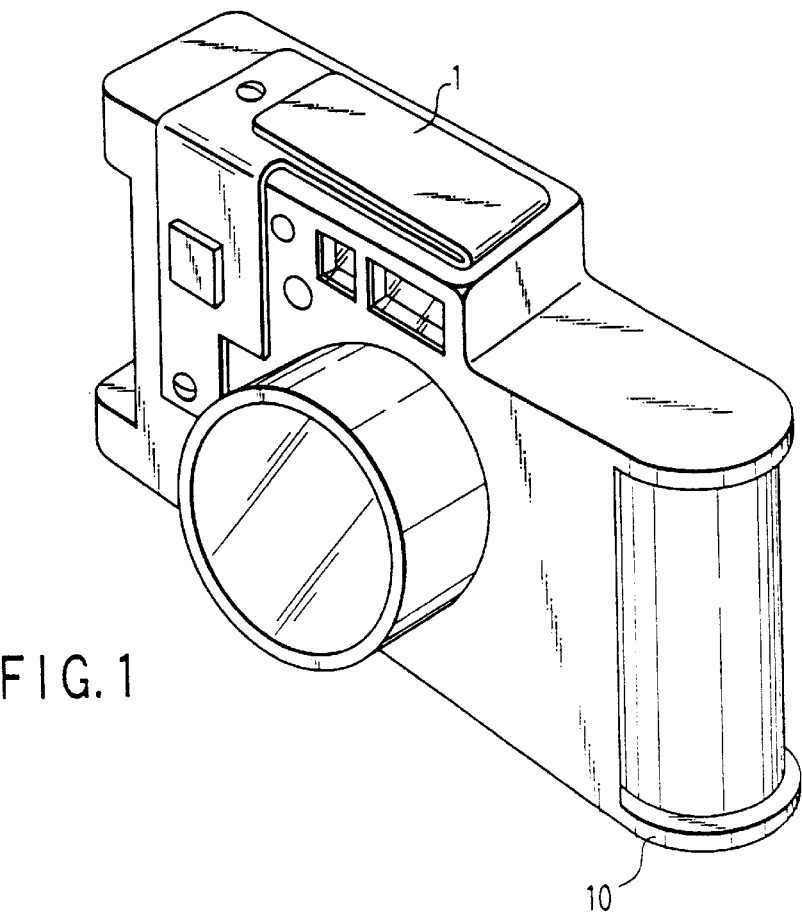
FIG. 1 is an oblique view, partly broken away, showing a camera having a flexible printed circuit board (FPC) mounted therein according to one embodiment of the present invention.

Reference will now be made in detail to the presently preferred embodiments of the invention as illustrated in the accompanying drawings, in which like reference characters designate like or corresponding parts throughout the several drawings.

FIG. 1 is an oblique view showing a camera according to one embodiment of the present invention. As shown in the drawing, an outer casing of a camera body 10 is detached to show a substantially L-shaped FPC 1 mounted within the camera body 10. The FPC 1 is mounted to cover a left end portion and an upper portion of the camera body 10 and bent at substantially 180° at an upper portion of the camera body 10. It is possible to mount a circuit construction serving to control the entire camera body 10 to the FPC 1. Alternatively, a circuit construction serving to control a part, e.g., AF portion, of the camera body 10 may be mounted to the FPC 1.

Figure 2:
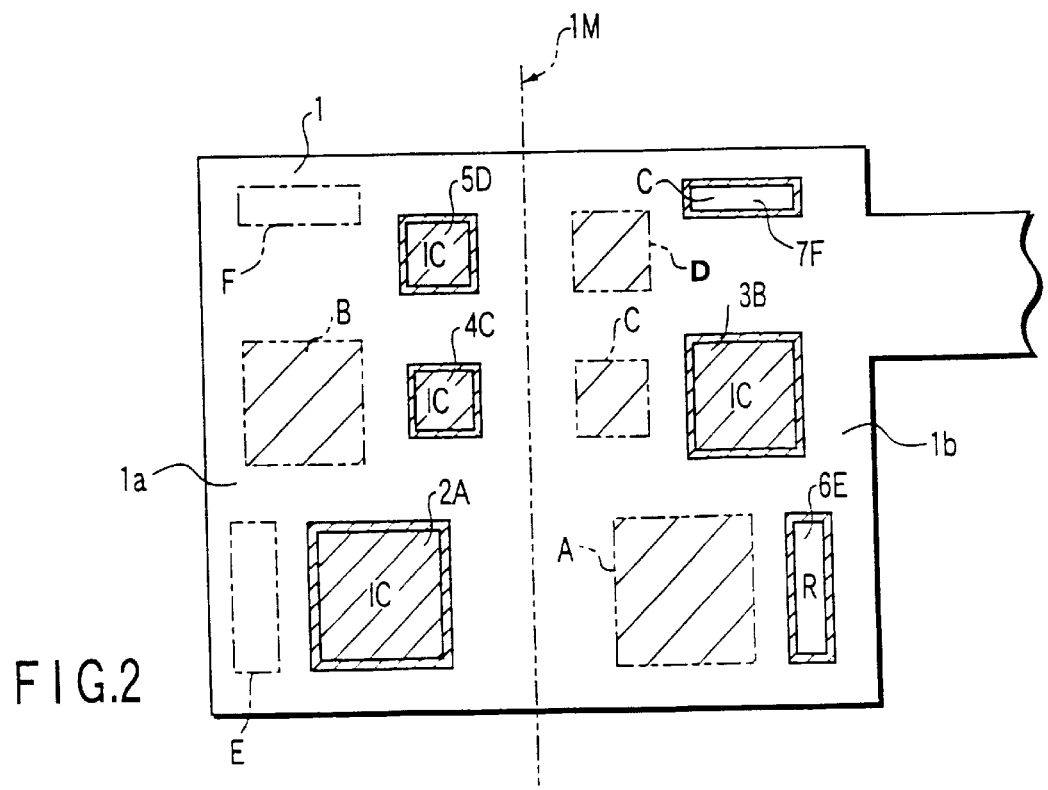
FIG. 2 is a plan view showing an FPC and electronic circuit elements such as ICs mounted on the FPC, which are included in a camera according to one embodiment of the present invention.

FIG. 2 is a plan view exemplifying how electronic devices such as ICs and other electronic parts are arranged on the FPC 1 according to one embodiment of the present invention. As shown in the drawing, a plurality of ICs 2A, 3B, 4C, 5D are FC-mounted to the FPC 1 together with other planar mounting type electronic parts 6E, 7F such as a resistor and a capacitor. These ICs and electronic parts are connected to each other by a wiring pattern (not shown) to constitute a desired electric circuit serving to control at least a part of the camera body.

It should be noted that the ICs 2A, 3B, 4C, 5D and the other electronic parts 6E, 7F are positioned not to overlap with each other when the FPC 1 is bent by substantially 180° along a bending line 1M so as to be mounted within the camera body 10. To be more specific, regions A, B, C, D, E, F of FPC 1 shown in FIG. 2 show the regions overlapping with the ICs 2A, 3B, 4C, 5D and the other electronic parts 6E, 7F, respectively, when the FPC is bent by 180° along the bending line 1M. In other words, the ICs 2A, 3B, 4C, 5D and the other electronic parts 6E, 7F are positioned in symmetry with the regions A, B, C, D, E, F, respectively, with respect to the bending line 1M. It should be noted that the ICs 2A, 3B, 4C, 5D and the other electronic parts 6E, 7F are arranged not to overlap with the regions A, B, C, D, E, F (mounting arranging means) as shown in FIG. 2. It follows that these ICs and the other electronic parts do not overlap with each other when the FPC 1 is bent by 180° along the bending line 1M. In other words, the regions A, B, C, D, E, F form inhibiting regions in which ICs and other electronic parts should not be mounted. Further, the wiring pattern for these regions A, B, C, D, E, F is covered with, for example, a cover-lay for the insulating purpose.

It is practically desirable to make the area of each of these regions A, B, C, D, E, F somewhat larger than the area of each of the ICs 2A, 3B, 4C, 5D and the other electronic parts 6E, 7F in order to prevent an overlapping problem in the case where the FPC is bent by about 180° about a line somewhat deviant from the bending line 1M.

In the embodiment shown in FIG. 2, the ICs 2A, 3B, 4C, 5D and the other electronic parts 6E, 7F are FC-mounted on one surface of the FPC 1. However, it is also possible to use a printed circuit board 1A as shown in FIG. 3C. In this case, ICs and other electronic parts can be FC-mounted to both surfaces of the printed circuit board 1A such that these electronic parts do not overlap with each other when the printed circuit board 1A is bent by about 180° along a predetermined bending line.

Figure 3A:
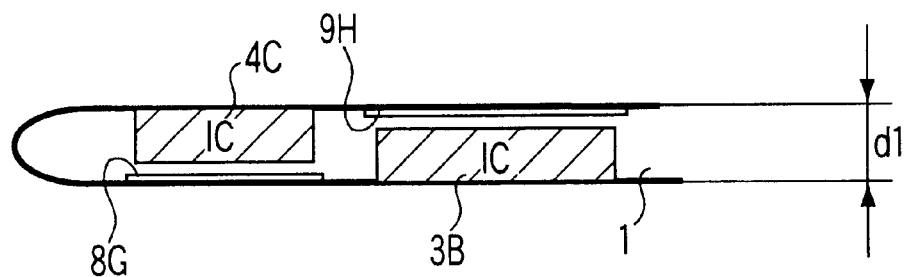
FIGS. 3A, 3B and 3C are cross sectional views each showing how the FPC shown in FIG. 2 is bent when the FPC is mounted in the camera body shown in FIG. 1.
Figure 3B:
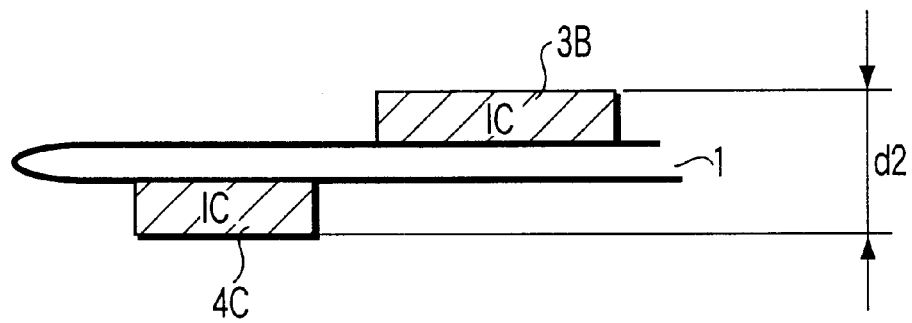
Figure 3C:
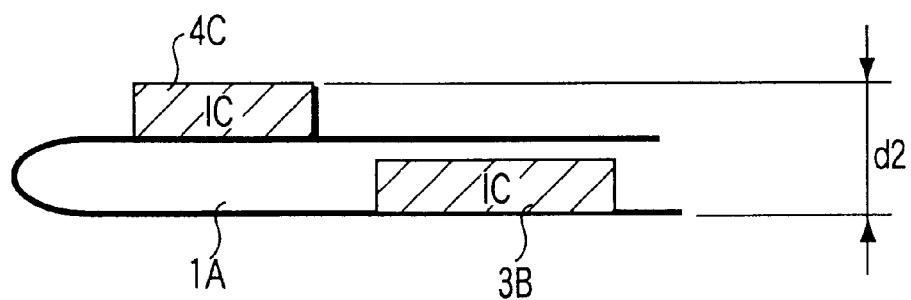

FIGS. 3A, 3B, 3C are cross sectional views each showing how an FPC is bent when the FPC is mounted in a camera body. FIGS. 3A and 3B differ from each other in the bending direction of the FPC. In the embodiment shown in FIG. 2, four ICs and two additional electronic parts are FC-mounted to the FPC. It should be noted, however, that each of FIGS. 3A and 3B covers a cross section along a line passing through ICs 3B and 4C.

To be more specific, the FPC 1 shown in FIG. 2 is divided by the bending line 1M into first and second regions 1a and 1b. The IC 3B is mounted to the second region 1b, with the IC 4C being mounted to the first region 1a of the FPC 1. It should be noted that these ICs 3B and 4C are positioned asymmetry with each other with respect to the bending line 1M.

In FIG. 3A, the FPC 1 is bent to permit the ICs 3B and 4C to be positioned inside the bent FPC 1. In FIG. 3B, however, the FPC 1 is bent to permit the ICs 3B and 4C to be positioned outside the bent. FPC 1.

In FIG. 3A, a total thickness d1 of the bent FPC 1 is determined substantially by a thickness of IC 3B or IC 4C, whichever is thicker. To be more specific, since the ICs 3B and 4C do not overlap with each other, the total thickness d1 noted above is determined by formula (1) given below:

$$d1 \doteq A + 2B \qquad (1)$$

where A is the thickness of IC 3B or IC 4C, and B is the thickness of FPC 1.

Where the FPC 1 is bent as shown in FIG. 3B, the total thickness d2 is determined by formula (2) given below:

$$d2 \doteq 2A + 2B \quad (2)$$

where A is the thickness of IC, and B is the thickness of FPC.

The total thickness d1 shown in FIG. 3A is smaller than the total thickness d2 shown in FIG. 3B. Also, the ICs 3B and 4C are held between the bent regions 1a and 1b of the FPC 1 in FIG. 3A. Where the FPC 1 is bent as shown in FIG. 3A, it is effective to form sealing solid patterns 8G and 9H each consisting of a copper foil on the dead space such as regions B and C of the FPC 1 shown in FIG. 2. In the case of forming these solid patterns 8G, 9H, it is possible to shield considerably the electromagnetic interference and coupling acting from the back side of the ICs 3B, 4C opposite to the FC-mounting side.

In order to take a more satisfactory measure against EMI (electromagnetic interference), it is desirable to form shielding solid patterns of copper foils, which are denoted by hatching in FIG. 2, on the front surfaces (FC-mounting surfaces) of the ICs 3B, 4C, etc. as well as on the regions B, C, etc. These shielding solid patterns are generally connected to the ground. Where a measure against EMI need not be taken, the free space of the FPC 1 can be used as a simple wiring region for forming various signal lines.

Where ICs and other electronic parts are FC-mounted on one surface of the FPC 1 as shown in FIG. 3A, it suffices to cover the entire region on the opposite surface of the FPC 1 with a highly insulating cover-lay. Therefore, when the FPC 1 is mounted to the camera body, the insulating properties can be markedly improved.

On the other hand, where the FPC 1 is bent as shown in FIG. 3B, the total thickness of the bent FPC 1 is increased in an amount corresponding to the thickness of one IC, compared with the case where the FPC 1 is bent as shown in FIG. 3A. However, the ICs 3B and 4C are prevented from being brought into direct contact with the dead space on the same surface of the FPC 1 such as the regions B and C when the FPC 1 is bent as shown in FIG. 3B along the bending line 1M. It follows that additional electronic parts can be mounted to the dead space such as the regions B and C, leading to an improved mounting efficiency of the FPC 1. It should be noted, however, that the ICs 3B and 4C are likely to receive electromagnetic interference and coupling when the IPC 1 is bent as shown in FIG. 3B, making it necessary to take any measure against EMI.

FIG. 3C shows that ICs and other electronic parts are formed on both surfaces of the printed circuit board 1A, as described previously. The arrangement of FIG. 3C has features similar to those of the arrangements shown in FIGS. 3A and 3B.

As apparent from the above description, it suffices to determine the construction and arrangement from among those shown in FIGS. 3A, 3B and 3C in view of the merits of these construction and arrangement and the mode of mounting of the FPC in the camera body 10.

As described above, a plurality of ICs and other electronic parts are FC-mounted to an FPC (flexible printed circuit board) in an arrangement that, when the FPC is bent at about 180° along a predetermined bending line, these ICs and other electronic parts do not overlap with each other. In other words, these ICs and other electronic parts are arranged on the FPC in asymmetry with respect to the predetermined bending line so as to prevent the exposed surface of the FC-mounted IC from being brought into direct contact with another electronic part when the FPC is bent at about 180° along the predetermined bending line.

In the embodiment described above, the FPC 1 is bent only once. However, it is also possible to bend the FPC a plurality of times to form a structure of bellows, if there is an allowance in the mounting space.

Needless to say, the technical idea of the present invention can also be applied to a flexible-rigid printed circuit board in which a hard substrate is combined with an FPC.

As described above, the exposed surface of an FC-mounted IC is brought into contact only with an insulating portion such as a cover-lay of the FPC even if the FPC is bent by substantially 180° along a predetermined bending line, making it unnecessary to insert an insulating sheet.

It should also be noted that, since an FC-mounted IC does not overlap with another FC-mounted IC or with another electronic part when the FPC is bent by about 180° along a predetermined bending line, it is possible to decrease without fail the total thickness of the bent FPC in an amount corresponding to the thickness of the FC-mounted IC or other electronic part.

Further, since the FC-mounted ICs are not positioned close to each other or to contact each other when the FPC is bent by substantially 180°, it is possible to suppress the electromagnetic interference or coupling.

As described above, the present invention provides a camera comprising a camera body and an FPC mounted in a bent state in the camera body, said FPC having ICs and other electronic parts mounted thereon by means of FC-mounting. In the present invention, the. FC-mounted ICs and other electronic parts are arranged on the FPC not to overlap with or contact each other when the FPC is bent by substantially 180° along a predetermined bending line. As a result, it is unnecessary to take any special measure for insulation, and the total thickness of the bent FPC is not increased when the FPC is bent for mounting in the camera body. In addition, it is possible to suppress the effects given by the electromagnetic interference or coupling to the ICs and other electronic parts mounted to the FPC. It follows that the technical idea of the present invention makes it possible to ensure a high reliability in the mounting of ICs and other electronic parts in a small mounting space and to contribute to miniaturization of the camera.

The specific embodiments described above cover the inventions of the constructions given below:

Appendix 1: A camera comprising a camera body and a flexible printed circuit board having a plurality of ICs flip chip-mounted thereon, characterized in that said flip chip-mounted ICs are arranged on a surface of said flexible printed circuit board such that, when the flexible printed circuit board is bent by substantially 180° along a predetermined bending line to permit the IC-mounted surfaces of the bent portions of the flexible printed circuit board to face each other, these ICs do not overlap with each other.

Appendix 2: The camera according to appendix 1, wherein at least two ICs are flip chip-mounted to said flexible printed circuit board and the flexible printed circuit board is bent along at least one bending line for mounting in the camera body.

Appendix 3: The camera according to appendix 1, wherein other electronic parts are mounted to said flexible printed circuit board together with said flip chip-mounted ICs on the same surface of the flexible printed circuit board, said other electronic parts being arranged in asymmetry with the flip chip-mounted ICs with respect to said bending line of the flexible printed circuit board such that these other electronic parts are not brought into contact with the flip chip-mounted ICs when the flexible printed circuit board is bent by substantially 180° along the bending line.

Appendix 4: A camera comprising a camera body and a flexible printed circuit board having a plurality of ICs flip chip-mounted thereon, characterized by comprising:

a bending line formed in said flexible printed circuit board to divide the flexible printed circuit board into a first region and a second region, the flexible printed circuit board being bent along said bending line when the board is mounted in said camera body; and an IC-arranging means for flip chip-mounting a first IC chip and a second IC chip on said first and second regions of the flexible printed circuit board, respectively, and for controlling other electronic parts not to be mounted on those portions of the flexible printed circuit board which are in symmetry with the flip chip-mounted first and second IC chips with respect to said bending line.

Appendix 5: The camera according to appendix 4, wherein conductive shielding patterns are formed on those portions of the flexible printed circuit board which are in symmetry with the flip chip-mounted first and second IC chips with respect to said bending line.

Appendix 6: The camera according to appendix 4, wherein said first and second IC chips are mounted on the same surface of said flexible printed circuit board.

Appendix 7: The camera according to appendix 4, wherein said first IC chip is mounted on a front surface of the flexible printed circuit board and said second IC chip is mounted on a back surface of the flexible printed circuit board.

Appendix 8: The camera according to appendix 6, wherein said flexible printed circuit board is bent along said bending line when the flexible printed circuit board is mounted in said camera body such that said first and second IC chips are positioned on the outer surfaces of the bent portions of the flexible printed circuit board.

Appendix 9: The camera according to appendix 6, wherein said flexible printed circuit board is bent along said bending line when the flexible printed circuit board is mounted in said camera body such that said first and second IC chips are positioned on the inner surfaces of the bent portions of the flexible printed circuit board.

Appendix 10: A camera comprising a camera body and a flexible printed circuit board having a plurality of IC chips mounted thereon, characterized in that these IC chips are arranged on the flexible printed circuit board such that, when the flexible printed circuit board is bent along a predetermined bending line for mounting the bent flexible printed circuit board in said camera body, these IC chips do not overlap with each other.

Appendix 11: The camera according to appendix 10, wherein said IC chips are flip chip-mounted to said flexible printed circuit board.

Appendix 12: A camera comprising a camera body and a flexible printed circuit board having a plurality of IC chips flip chip-mounted thereon, characterized by comprising:

a bending line formed in said flexible printed circuit board to divide the flexible printed circuit board into a first region and a second region, the flexible printed circuit board being bent along said bending line when the board is mounted in said camera body; and mounting arranging means for flip chip-mounting a first IC chip and a second IC chip on said first and second regions of the flexible printed circuit board, respectively, and for controlling other electronic parts not to be mounted on those portions of the flexible printed circuit board which are in symmetry with the flip chip-mounted first and second IC chips with respect to said bending line.

According to the present invention, provided is a camera comprising a camera body and an FPC mounted in a bent state in the camera body, said FPC having ICs and other electronic parts mounted thereon by means of FC-mounting. In the present invention, the FC-mounted ICs and other electronic parts are arranged on the FPC not to overlap with or contact each other when the FPC is bent by substantially 180° along a predetermined bending line. As a result, it is unnecessary to take any special measure for insulation, and the total thickness of the bent FPC is not increased when the FPC is bent for mounting in the camera body. In addition, it is possible to suppress the effects given by the electromagnetic interference or coupling to the ICs and other electronic parts mounted to the FPC. It follows that the technical idea of the present invention makes it possible to ensure a high reliability in the mounting of ICs and other electronic parts in a small mounting space and to contribute to miniaturization of the camera.

As described above in detail, the present invention provides a camera comprising a camera body and an FPC having electronic parts such as IC chips FC-mounted thereon. The FPC is bent when mounted in the camera body. In the present invention, the electronic parts are mounted to the FPC in a manner to decrease the total thickness of the bent FPC when the bent FPC is mounted in the camera body. Also, the electronic parts are arranged to prevent the mutual contact when the FPC is bent for mounting in the camera body, thereby to prevent short circuiting among the electronic parts. In addition, it is possible to suppress the effect given to each IC chip by the electromagnetic (electric field) interference and coupling.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A camera comprising:

a camera body;

a flexible printed circuit board having a plurality of IC chips flip chip-mounted thereon as an electronic circuit for controlling at least a part of said camera body, said plurality of IC chips being asymmetrically arranged with respect to a predetermined bending line of said flexible printed circuit board such that, when said flexible printed circuit board is bent along said bending line for mounting said flexible printed circuit board on said camera body, said plurality of IC chips do not overlap with each other;

a first conductive shield pattern formed on said flexible printed circuit board in symmetry with said plurality of IC chips with respect to said bending line; and a second conductive shield pattern formed on portions of said flexible printed circuit board on which said plurality of IC chips are flip chip-mounted.

2. The camera according to claim 1, wherein electronic parts other than said plurality of IC chips are mounted on said flexible printed circuit board apart from said plurality of IC chips and asymmetrically with respect to said bending line such that said plurality of IC chips and said other electronic parts do not overlap with each other when said flexible printed circuit board is bent along said bending line.

3. A camera comprising:

a camera body;

a flexible printed circuit board having at least first and second IC chips flip chip-mounted thereon as an electronic circuit for controlling at least a part of said camera body, said flexible printed circuit board being bent along a predetermined bending line when mounted to said camera body to form first and second regions on which said first and second IC chips are mounted, respectively, and said first and second IC chips being asymmetrically arranged with respect to said bending line such that said first and second IC chips do not overlap with each other when said flexible printed circuit board is bent along said bending line;

first conductive shield patterns formed on portions of said flexible printed circuit board which are asymmetrical with said first and second IC chips with respect to said bending line; and second conductive shield patterns formed on portions of the flexible printed circuit board on which said first and second IC chips are flip chip-mounted.

4. The camera according to claim 3, wherein electronic parts other than said first and second IC chips are mounted on said flexible printed circuit board and asymmetrically arranged with said first and second IC chips with respect to said bending line such that said other electronic parts do not overlap with said first and second IC chips when said flexible printed circuit board is bent along said bending line.

5. The camera according to claim 4, wherein said first and second IC chips and said other electronic parts are mounted to a conductive wiring pattern formed on one surface of said flexible printed circuit board.

* * * * *